United States Patent [19]

Hawkswell

[11] Patent Number: 4,610,473
[45] Date of Patent: Sep. 9, 1986

[54] HEAD AND METHOD FOR ORIENTING ELECTRICAL COMPONENTS

[75] Inventor: Victor T. Hawkswell, Witham, England

[73] Assignee: Emhart Corporation, Hartford, Conn.

[21] Appl. No.: 707,853

[22] Filed: Mar. 4, 1985

[30] Foreign Application Priority Data

Mar. 8, 1984 [GB] United Kingdom ............... 8406129

[51] Int. Cl.$^4$ ............................................. B65G 47/91
[52] U.S. Cl. ..................................... 294/64.1; 29/740; 29/743; 294/2
[58] Field of Search ............... 294/2, 64.1; 29/740, 29/743; 269/21; 279/3; 414/72, 121, 627, 737, 744 B, 752

[56] References Cited

U.S. PATENT DOCUMENTS

| | | | |
|---|---|---|---|
| 3,676,911 | 7/1972 | Austin | 29/743 X |
| 4,290,732 | 9/1981 | Taki et al. | 294/64.1 X |
| 4,346,514 | 8/1982 | Makizawa et al. | 29/740 |
| 4,381,601 | 5/1983 | Tamai et al. | 29/740 |
| 4,437,232 | 3/1984 | Araki et al. | 294/2 X |
| 4,473,247 | 9/1984 | Itemadani et al. | 294/64.1 X |

*Primary Examiner*—Johnny D. Cherry
*Attorney, Agent, or Firm*—William F. White

[57] ABSTRACT

In known pick-up heads for orienting electrical components the component, supported by a pick-up tool, is engaged by a plurality of pairs of opposed jaws to urge the component into a desired orientation. When the components become oriented, the pairs of jaws exert a slight gripping force on the component which can damage fragile components, for example so-called "chips". In the invention, a datum face of the pick-up tool against which the component is supported has the same peripheral shape as the component but each dimension is slightly larger than the corresponding dimension of the component and orienting faces of the jaws are disposed to engage the periphery of the pick-up tool when the component is oriented so that the components are not gripped between the pairs of jaws. Likelihood of damage is thus reduced.

6 Claims, 2 Drawing Figures

U.S. Patent  Sep. 9, 1986  4,610,473
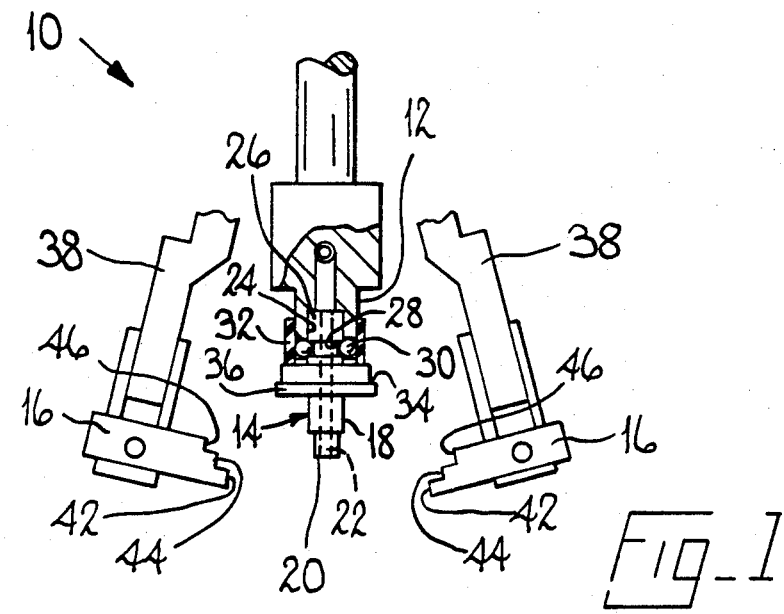
Fig_1
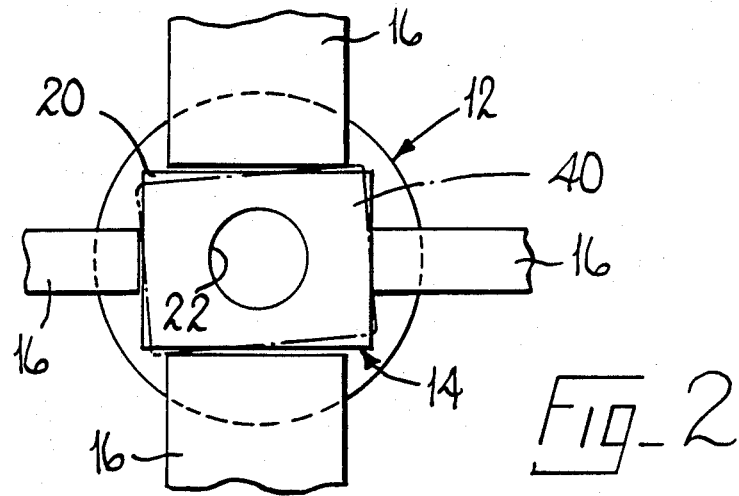
Fig_2

HEAD AND METHOD FOR ORIENTING ELECTRICAL COMPONENTS

FIELD OF THE INVENTION

This invention is concerned with a head and method for orienting electrical components and is especially concerned with orienting so called "chips".

BACKGROUND OF THE INVENTION

It is necessary to orient electrical components for a variety of purposes in modern technology. One major area in which components commonly have to be oriented is in the application of the components to substrates, for example printed circuit boards, in the assembly of electronic circuitry, or for example in positioning "chips" for further operations for example wire bonding. In the handling of electronic components, it is essential for many operations that the components be precisely positioned in a desired orientation, for placement at designated locations in a desired orientation. Many machines have been proposed for accurately placing components on substrates. Some previously known machines have included so-called pick-up heads by which components are picked from a component supply and placed in a desired position and orientation on a suitable substrate. U.S. Pat. Nos. 4,135,630 and 4,290,732 both describe machines for picking up electrical components and placing the, in desired orientations, at desired positions on a suitable substrate. The pick-up heads of the machines described in each of these U.S. Patents have means by which the components are held on the pick-head, viz. a vacuum or suction tool, and so-called pawls or fingers by which the components are positioned accurately in correct orientation on the tool. The machines of this type are capable of very precise positioning of components of appropriate size and can be arranged to handle a variety of different components, for example so-called flat packs, S.O. style transistors, leadless chip carriers and the like, as well as "chips". Such machines have been found to be fairly satisfactory in handling components in many respects, but in handling "chips" which are generally extremely fragile, the gripping of the chips between opposed pairs of pawls, fingers, tweezers, or jaws (various names by which the relevant instrumentalities are commonly called) has led to an unacceptable high rate of damage to the chips, for example by cracking or chipping out of a piece of the "chip".

OBJECTS OF THE INVENTION

It is one of the objects of the present invention to provide a head and method for orienting electrical components which militates against damaging of the components.

SUMMARY OF THE INVENTION

The invention provides, in one of its aspects, a head for orienting electrical components comprising a pick-up tool having a datum face of the same peripheral shape as the component to be picked up but each dimension being slightly larger than the corresponding dimension of the component, at least one pair of opposed jaws each jaw having at least one orienting face disposed to cooperate with corresponding orienting faces of the other jaws of the head as the pairs of jaws are moved towards one another, a component supported on the datum face being engaged by the orienting faces as the jaws of each pair are moved towards one another whereby to orient the component in register with the datum face, the orienting faces being disposed to engage the periphery of the pick-up tool when the component is oriented.

The invention also provides a method of orienting an electrical component comprising supporting a component on a datum face of a pick-up tool, the datum face being of the same peripheral shape as the component to be picked up but each dimension being slightly larger than the corresponding dimension of the component and moving at least one pair of opposed jaws towards one another whereby corresponding orienting faces of the jaws engage edge portions of the component and urge the component into register with the datum face, the orienting faces of the jaws engaging the periphery of the pick-up tool when the component is oriented.

Preferably each jaw of a head in accordance with the invention has a plurality of orienting faces, the orienting faces of each jaw being disposed to cooperate with corresponding orienting faces of the other jaws of the head to provide a plurality of sets of orienting jaws. Where each jaw has a plurality of orienting faces, the head is preferably so constructed and arranged that the datum face of a pick-up tool is disposed in the operation of the head to support a component in register with a corresponding one of the sets of orienting faces. This may be achieved by a variety of means, for example by mounting the pick-up tool on a tool holder the height of which can be adjusted relative to the pick-up jaws. Conveniently a head according to the invention comprises means for interchangeable mounting, for example on a tool holder, the pick-up tool on the head; where the tools are interchangeably mounted, selection of the tool is disposed to support a component in register with the corresponding one of the sets of orienting jaws. Where the tools are interchangeably mounted, a range of tools may conveniently be carried in a suitable tool-support of a machine in which the head is mounted.

Preferably a head in accordance with the invention comprises a plurality of pairs of opposed jaws. A head in accordance with the invention for handling rectangular components preferably comprises two opposed pairs of pick-up jaws, the jaws of each pair having their orienting faces parallel to one another and disposed at right angles to the orienting faces of the other pair of jaws, and the datum face of the pick-up tool is rectangular.

In a machine in accordance with the invention the component is supported on the datum face by an appropriate means; conveniently components are supported on the datum face by vacuum applied through an opening in the datum face of the tool.

In the operation of a head according to the invention in carrying out a method according to the invention, the orienting faces of the jaws engage edge portions of the component, as the pairs of opposed jaws are moved towards one another, thus to urge the component into register with the datum face of the pick-up tool. As the component reaches its oriented position, in which it is in register with the datum face, the edges of the component cease to project beyond the slightly larger periphery of the datum face and the orienting faces of the jaws engage the pick-up tool at the periphery of the datum face, thereby preventing the component being gripped between the opposed pairs of jaws and thus reducing the likelihood of any damage to the component occurring because of pressure exerted by the jaws gripping the component.

BRIEF DESCRIPTION OF THE DRAWINGS

In the accompanying drawings:

FIG. 1 is a diagrammatic front view showing parts of the head embodying the invention, with parts broken away; and FIG. 2 is a view looking upwardly showing the orientation of an electrical component carried by a pick-up tool of the head.

DESCRIPTION OF THE PREFERRED EMBODIMENTS

A pick-up head embodying the invention will normally be mounted in a machine for handling electrical components, for example machines of the type described in the aforementioned U.S. Patents. Known machines in which a pick-up head embodying the invention may be employed are those for placing electrical components on a substrate. Such machines conveniently comprise a tool support for supporting a plurality of pick-up tools, the machine being arranged so that tools carried by the pick-up head may be interchanged with tools in the support dependent upon the components which are to be handled. Such a machine for placing components on a substrate will also commonly comprise means for supporting the substrate in a datum location, means for relatively moving the pick-up head and the support of the substate whereby to place components carried by the pick-up head at desired locations and in desired orientations, on the substrate, and means for supplying components to the pick-up head to be picked up and oriented for transfer to the substate by the pick-up head. Means for supplying the components to the pick-up head may comprise so-called "sticks" in which larger components are carried, tape magazines in which components carried on tape are supplied to the pick-up head, and the like.

FIG. 1 shows a pick-up head 10 comprising a tool holder 12 in which a pick-up tool 14 is interchangeably mounted. The tool holder 12 is mounted on the head 10 for up and down movement relative to jaws 16 mounted on the head whereby to pick up components from a suitable component supply (not shown) and to place such picked up components at a desired location on a substate (not shown). The head 10 itself is likewise conveniently mounted for up and down movement to appropriately position the head relative to substrate and component supply means. The head 10 is also mounted for rotation about its longitudinal axis whereby to move a component oriented on the pick-up tool to a desired orientation relative to the substrate for placement thereon.

The pick-up tool 14 comprises a nose portion 18 terminating in datum face 20. A passage 22 in the tool 14 opens through the datum face 20. The tool holder 12 comprises means for interchangeably mounting the pick-up tool 14 thereon. This mounting means comprises a socket 24 in a lower most end portion of the tool holder in which a shank 26 of the tool is slidingly received. The tool holder 12 comprises retaining means resiliently biased into a recess 28 in the shank 26 of a tool 14 received in the socket 24 to retain the tool 14 on the holder 12. The retaining means comprises a plurality, viz. a pair, of balls 30 held captive in the holder 12 but projecting into the socket 24, the balls being resiliently biased into the socket by a resilient rubber sleeve 32 surrounding the balls 30 projecting from their housing in the holder 12 to urge the balls 30 inwardly of the socket 24. Each tool 14 is accurately located in a predetermined position relative to the tool holder 12 by engagement of a locating face 34 of a projecting collar 36 of the tool 14 with a lower most location face of the tool holder 12; the datum face 20 of the tool mounted in the tool holder 12 is thus located in a predetermined position relative to the tool holder. The passage 22 through the tool 14 is connected by a passage in the tool holder to a vacuum source of the machine in which the pick-up head 10 is mounted.

The jaws 16 are secured at lower end portions of arms 38 mounted on a main body portion of the head 10 (not shown) for pivotal movement towards and away from a component carried by the pick-up tool 14, when the tool holder 12 is located relative to the jaws 16 in a datum position. Whereas the jaws 16 are mounted on arms for pivotal movement towards and away from the pick-up tool, other means of mounting the jaws for movement towards and away from the pick-up tool are envisaged, for example the jaws may be mounted on slide ways for linear sliding movement towards and away from the pick-up tool. The arms 38 are arranged to be pivoted inwardly to move the jaws 16 towards the pick-up tool by any suitable means, for example pneumatic piston and cylinder arrangements (not shown); the arms 38 may be moved to carry the jaws away from the pick-up tool 14 likewise by any suitable means, for example they may be urged outwardly away from the pick-up tool by spring means (now shown).

As can be seen from FIG. 2 the datum face 20 of the pick-up tool 14 is of the same peripheral shape as a component, viz. a so-called "chip" 40 (shown in chain line in FIG. 2) to be picked up. However, each dimension of the datum face 20 is slightly larger than the corresponding dimension of the component (length and breadth of the rectangular chip 40). It is essential that each dimension of the datum face 20 be slightly greater than the corresponding dimension of the chip 40 but the difference in size should be as small as possible while ensuring that substantially all of the electrical components for the size associated with a particular pick-up tool will actually fall within the bounds of the datum face when aligned therewith (bearing in mind that there may be slight dimensional differences between components which are nominally identical). The dimensions of the datum face may be as little as 2 thousandths of an inch (0.05 mm) in excess of the corresponding dimensions of the component to be oriented for precise components e.g. semiconductor dice, but may be rather larger than the nominal dimensions of the component where the component has greater tolerances e.g. up to 10 thousandths of an inch (0.25 mm) for some capacitors. The machine embodying the invention shown in the drawings comprises two opposed pairs of jaws 16 (see FIG. 2) which cooperate to orient the chips 40. The jaws of each pair have their orienting faces 42, 44, 46 generally parallel to one another and disposed generally at right angles to the orienting faces of the other pair of jaws. Corresponding orienting faces of each of the jaws cooperate in the operation of the head to provide a set of orienting faces, for example the faces 44 provide such a set.

In a method of orienting an electronic component embodying the invention, the component to be oriented is supported on the datum face 20 of the pick-up tool 14 of the machine embodying the invention shown in the drawings. With the correct pick-up tool 14 accommodated in the tool holder 12, the pick-up head 10 and a component magazine are moved into register with one another so that the pick-up tool is aligned with a component e.g. the chip 40 at an outlet position of the magazine. The pick-up head 10 is then lowered and the tool holder 12 lowered relative to the pick-up head to engage the component with the datum face 20 of the tool. Vacuum is applied to the passage 22 so that the component is retained against the datum face 20. The component (which will have been presented to the pick-up tool 14 by the magazine in an orientation which is generally that desired) held against the datum face 10 by the vacuum, is lifted from the magazine by raising the tool holder relative to the pick-up head until the tool holder reaches a datum position relative to the head in which the appropriate set of orienting faces 42, 44, 46 are aligned with the component, viz. the chip 40, supported by the datum face 20 of the tool 14. The datum face 20 of the tool 14 is of the same peripheral shape as the chip 40, but each dimension of the face 20 is slightly larger than the corresponding dimension of the chip 40. When the tool holder 12 has reached its datum position in the head, the means for moving the arms 38 (not shown) are operated to pivot the arms inwardly thereby moving the pairs of opposed jaws towards one another. The orienting faces of the appropriate set of faces 42, 44, 46 engage edge portions of the chip 40 as the jaws move inwardly and urge the chip 40 into register with the datum face 20. When the chip 40 has been oriented so that its edges lie within the peripheral shape of the datum face 20, the appropriate set of orienting faces 42, 44, 46 of the jaws engage the periphery of the pick-up tool 14 around the datum face; thus no gripping pressure is exerted on the component 40 and the likelihood of damage to the component is reduced. In the machine shown the tools 14 are rotatable in the tool holder 12 and, if not oriented precisely accurately when first mounted on the holder, will be oriented by engagement of the orienting faces of the jaws; alternatively the tools 14 and holder 12 may be constructed so that the tools cannot be rotated relative to the holder 12 and are always mounted in the correct orientation.

Suitable pick-up tools 14 must be provided for each size and shape of component which is to be handled by a head embodying the invention. Each tool is conveniently supported in a tool support (not shown) and the tools can readily be exchanged by moving the pick-up head into alignment with a receiving recess in the tool support, lowering the pick-up head to lower the tool on the head into the recess, engaging the collar 36 by a stripper plate of the tool support and raising the pick-up head, while the tool is held in the recess by the stripper plate, to separate the tool holder from the tool. The head and tool support may then be relatively moved to bring the tool holder into alignment with a further tool, the holder 12 being lowered into engagement with the tool to receive the shank 26 thereof in the socket 24; with the stripper plate moved clear, the tool holder is then raised carrying with it the new tool. The new tool is then used to pick up from the component magazine, a component of a suitable shape. This will be oriented in a similar manner to that described previously, relative to the pick-up head.

An oriented component will be placed on a suitable substrate by lowering the tool holder (having first moved the jaws 16 clear) to place the component at a desired position on the substate, the pick-up head and substrate having been moved relative to one another to align the tool holder with the appropriate location on the substrate. The pick-up head 10 may be rotated by suitable means (not shown) while the appropriate set of faces 42, 44, 46 is in engagement with the periphery of the pick-up tool to rotate the chip 40 (which is oriented relative to the head) to a desired orientation relative to the substate. The datum face 20 of a pick-up tool 14 may be aligned with the appropriate one of the sets of faces 42, 44, 46 on the jaws by any suitable means, for example the tool holder 12 may always be raised to the same datum position relative to the pick-up head, in which case the nose portion 18 of the pick-up tool 14 will be selected to be of a length appropriate to align a component carried on the datum face 20 of that tool with the appropriate one of the sets of orienting faces 42, 44, 46 or the pick-up head 10 may be so constructed and arranged as to raise the tool holder 12 relative to the head to an appropriate one of several datum positions to align the datum face of the pick-up tool (the tool having a nose portion 18 of known length) with the appropriate one of the sets of orienting faces 42, 44, 46.

The pick-up head embodying the invention described hereinbefore with reference to the drawings is found to significantly reduce the likelihood of damage to components oriented by the head. It is to be understood that the thus disclosed pick-up head and method merely illustrates the invention by way of example. Other pick-up head configurations and methodology may be encompassed by the present invention.

What is claimed is:

1. An electrical component pick-up system for use within a component placement machine wherein various sizes of electrical components are to be picked up from one or more supply sources and placed on substrates, said system comprising a plurality of means for picking up components of different sizes, each of said pick-up means having a datum face located thereon which contacts the component to be picked up, said datum face having the same peripheral shape as the component size that is to be picked up, said datum face furthermore having peripheral face dimensions slightly larger than the corresponding peripheral dimensions of the component size to be picked up;

means for operatively holding one of said plurality of pick-up means at any one time whereby the thus held pick-up means is operative to pick-up a component and thereafter place the component, said holding means including means for receiving a different pick-up means for picking up a different size of component; and at least one pair of opposing jaws, each jaw having at least one orienting face disposed to cooperate with a corresponding orienting face of the other jaw as the jaws are moved toward each other whereby each orienting face engages a corresponding peripheral edge of a particularly held pick-up means employed for picking up a particular component size so that the particular component size is oriented with respect to the datum face upon engagement of the orienting faces of said pair of jaws with the corresponding peripheral edge of the particular pick-up means.

2. The electrical component pick-up system of claim 1 wherein each jaw within a pair of jaws has a plurality of orienting faces, the orienting faces of each jaw being disposed to cooperate with the corresponding orienting faces of the opposing jaw so as to provide a plurality of sets of orienting faces which cooperate with different pick-up means having different datum faces for picking up different component sizes.

3. The electrical component pick-up system of claim 1 comprising a plurality of pairs of opposing jaws each having at least one orienting face.

4. The electrical component pick-up system of claim 3 wherein each jaw within a pair of jaws has a plurality of orienting faces, the orienting faces of each jaw being disposed to cooperate with the corresponding orienting faces of the opposing jaw so as to provide a plurality of sets of orienting faces which cooperate with different pick-up means having different datum faces for picking up different component sizes.

5. The electrical component pick-up system of claim 1 wherein at least one of said plurality of pick-up means has a rectangular datum face and wherein the jaws of each pair of jaws are arranged so that respective orienting faces of each pair of jaws are parallel to each other and disposed at right angles to the orienting faces of the other pair of jaws.

6. The electrical component pick-up system of claim 1 wherein each of said plurality of pick-up means has an opening in the respective datum face through which a vacuum may be applied to retain a component on the respective datum face.

* * * * *